(12) United States Patent
Dailey et al.

(10) Patent No.: US 6,751,098 B2
(45) Date of Patent: Jun. 15, 2004

(54) HEAT SINK FOR A RADIOGRAPHIC SENSOR DEVICE

(75) Inventors: George W. Dailey, Glen Ellyn, IL (US); James F. Caruba, Bartlett, IL (US)

(73) Assignee: Siemens Medical Solutions USA, Inc., Malvern, PA (US)

(*) Notice: Subject to any disclaimer, the term of this patent is extended or adjusted under 35 U.S.C. 154(b) by 217 days.

(21) Appl. No.: 09/986,380

(22) Filed: Nov. 8, 2001

(65) Prior Publication Data

US 2003/0085359 A1 May 8, 2003

(51) Int. Cl.$^7$ ................................................. H05K 7/20
(52) U.S. Cl. ...................... 361/704; 361/705; 361/706; 165/80.3; 257/707
(58) Field of Search ...................... 250/370.09, 370.12, 250/370.13, 370.14, 370.15; 165/80.3, 185; 174/16.3, 252; 439/485, 487; 257/706, 707, 713, 718, 719, 726, 727; 361/704, 705, 706, 717–719, 720, 722

(56) References Cited

U.S. PATENT DOCUMENTS

| | | | | |
|---|---|---|---|---|
| 4,167,031 A | * | 9/1979 | Patel | 361/709 |
| 4,420,767 A | * | 12/1983 | Hodge et al. | 257/713 |
| 4,621,304 A | * | 11/1986 | Oogaki et al. | 361/720 |
| 6,209,623 B1 | * | 4/2001 | Tantoush | 165/80.3 |
| 6,359,281 B1 | * | 3/2002 | Pawlak et al. | 250/370.09 |
| 6,600,655 B1 | * | 7/2003 | Dailey et al. | 361/719 |
| 2002/0030972 A1 | * | 3/2002 | Ali et al. | |

* cited by examiner

Primary Examiner—Michael Datskovsky

(57) ABSTRACT

A heat sink system and method for a radiographic sensor device includes a heat sink formed of a first material possessing a predetermined thermal conductivity. The heat sink system further includes a thermal channel device formed of a second material possessing a predetermined thermal conductivity. The thermal channel device includes at least one contact portion adapted to contact the radiographic sensor device and an extending member that extends away from the at least one contact portion and contacts the heat sink. The thermal channel device is designed to extend between and substantially contact the heat sink and the radiographic sensor device when the heat sink system is assembled. The thermal channel device conducts heat from the radiographic sensor device to the heat sink.

14 Claims, 4 Drawing Sheets

HEAT SINK FOR A RADIOGRAPHIC SENSOR DEVICE

BACKGROUND OF THE INVENTION

1. Field of the Invention

The present invention relates generally to a heat sink, and more particularly to a heat sink for a radiographic sensor device.

2. Description of the Background Art

Radiographic imaging is the detection of radiation in order to form an image. By detecting the amount of radiation emanating from a test subject, the resultant image may give a representative view of the structure of the test subject.

Radiographic imaging typically employs gamma rays. Gamma rays are a form of radiation that is emitted by excited atomic nuclei during the process of passing to a lower excitation state. Gamma radiation is capable of passing through soft tissue and bone. Gamma radiation may be provided by a radiopharmaceutical, such as thallium or technetium, for example, that is administered to the patient. The radiopharmaceutical travels through the patient's body, and may be chosen to be absorbed or retained by an organ of interest. The radiopharmaceutical generates a predictable emission of gamma rays through the patient's body that can be detected and used to create an image.

A radiographic imaging device may be used to detect radiation emanating from the patient and may be used to form an image or images for viewing and diagnosis. The radiographic imaging device may be a device such as a gamma or gamma ray camera, also referred to as a scintillation camera or an Anger camera. The radiographic imaging device allows a doctor to perform a diagnosis on a patient in a non-invasive manner and additionally may allow the doctor to observe organ function. In addition, the radiographic imaging device may be used for other imaging functions.

A radiographic imaging device typically contains one or more radiographic sensor devices, such as a solid state detector. The detector may be a module made of cadmium zinc telluride (CZT) that generates an electrical signal representative of the location of gamma ray interaction in the detector material. The accumulated counts at each stored location (as stored in a memory device) may be used to create an image of the distributed radiation field of interest.

A number of radiographic sensor devices may be tiled in an array to form a detector head. The detector head may be formed such that the radiographic sensor devices are individually detachable for maintenance, adjustment, etc.

Sensor heating may occur in a radiographic sensor device, caused by heat generated during operation. This leads to several problems in a radiographic sensor device. The heat may degrade the sensor efficiency. A sensor at elevated temperatures is not as sensitive and is less able to detect extreme high or low levels of radiation from the subject. In addition, sensor heating may cause mechanical defects, such as warping or expansion and contraction of the sensor material, with resulting cracking or other mechanical failures.

In the prior art, cooling of the sensor may be achieved by using a cooling fluid. However, such cooling systems are complicated, expensive, and prone to failure. It is more common in the prior art to use a simple heat sink. Heat sinks are known in the art and are commonly used for solid state electronic components, such as processors, etc., and are mechanically simple and inexpensive. The conventional heat sink is typically fabricated of a metal possessing a high thermal conductivity. The conventional heat sink is generally rectangular in shape and physically contacts the device to be cooled, and may include cooling fins or protrusions that dissipate the heat into the surrounding air. This generally requires a large and continuous contact area between the heat producing device and the heat sink.

Although the prior art heat sink is acceptable for purely electronic devices, a conventional heat sink may be difficult to fit into a radiographic imaging device. For a radiographic detector head, the contact area available to the heat sink is necessarily limited. In addition, a heat sink in the prior art may not be designed to pass through an intervening circuit board, such as a PC board mating with a radiographic sensor device. Furthermore, a heat sink according to the prior art does not help to position the radiographic sensor device with respect to other sensor devices in a multi-device array, such that each sensor device is in the same plane.

Therefore, there remains a need for an improved heat sink for a radiographic imaging device.

SUMMARY OF THE INVENTION

A heat sink system for a radiographic sensor device is provided according to a first embodiment of the invention. The heat sink system comprises a heat sink formed of a first material possessing a first predetermined thermal conductivity. The heat sink system further comprises a thermal channel device formed of a second material possessing a second predetermined thermal conductivity. The thermal channel device comprises at least one contact portion adapted to contact the radiographic sensor device and an extending member that extends away from the at least one contact portion and contacts the heat sink. The thermal channel device is designed to extend between and substantially contact the heat sink and the radiographic sensor device when the heat sink system is assembled. The thermal channel device conducts heat from the radiographic sensor device to the heat sink.

A heat sink system for a radiographic sensor device is provided according to a second embodiment of the invention. The heat sink system comprises a heat sink formed of a first material possessing a first predetermined thermal conductivity. The heat sink system further comprises a thermal channel device formed of a second material possessing a second predetermined thermal conductivity. The thermal channel device is adapted to extend through a thermal channel aperture in an intervening circuit board positioned between the heat sink and the radiographic sensor device. The intervening circuit board is held in a spaced-apart relation from both the heat sink and the radiographic sensor device by the thermal channel device. The thermal channel device comprises at least one contact portion adapted to contact the radiographic sensor device and a substantially cylindrical extending member that extends away from the at least one contact portion and contacts the heat sink. The substantially cylindrical extending member includes a threaded outer surface portion adapted to receive a threaded fastener capable of removably affixing the thermal channel device to the intervening circuit board. The substantially cylindrical extending member further includes a threaded fastener aperture adapted to receive a threaded elongate fastener capable of removably affixing the thermal channel device to the heat sink. The thermal channel device is designed to extend through the intervening circuit board and to extend between and substantially contact the heat sink and the radiographic sensor device when the heat sink system is assembled. The thermal channel device conducts heat from the radiographic sensor device to the heat sink.

A method of conducting heat away from a radiographic sensor device is provided according to an embodiment of the invention. The method comprises the step of providing a heat sink formed of a first material possessing a first predetermined thermal conductivity. The method further comprises the step of providing a thermal channel device formed of a second material possessing a second predetermined thermal conductivity. The thermal channel device comprises at least one contact portion adapted to contact the radiographic sensor and an extending member that extends away from the at least one contact portion. The method further comprises the step of contacting the thermal channel device to the heat sink and to the radiographic sensor device. The thermal channel device conducts heat from the radiographic sensor device to the heat sink. The thermal channel device maintains the radiographic sensor device in a substantially parallel spaced-apart relation with the heat sink.

The above and other features and advantages of the present invention will be further understood from the following description of the preferred embodiments thereof, taken in conjunction with the accompanying drawings.

DETAILED DESCRIPTION OF THE PREFERRED EMBODIMENTS

Figure 1:
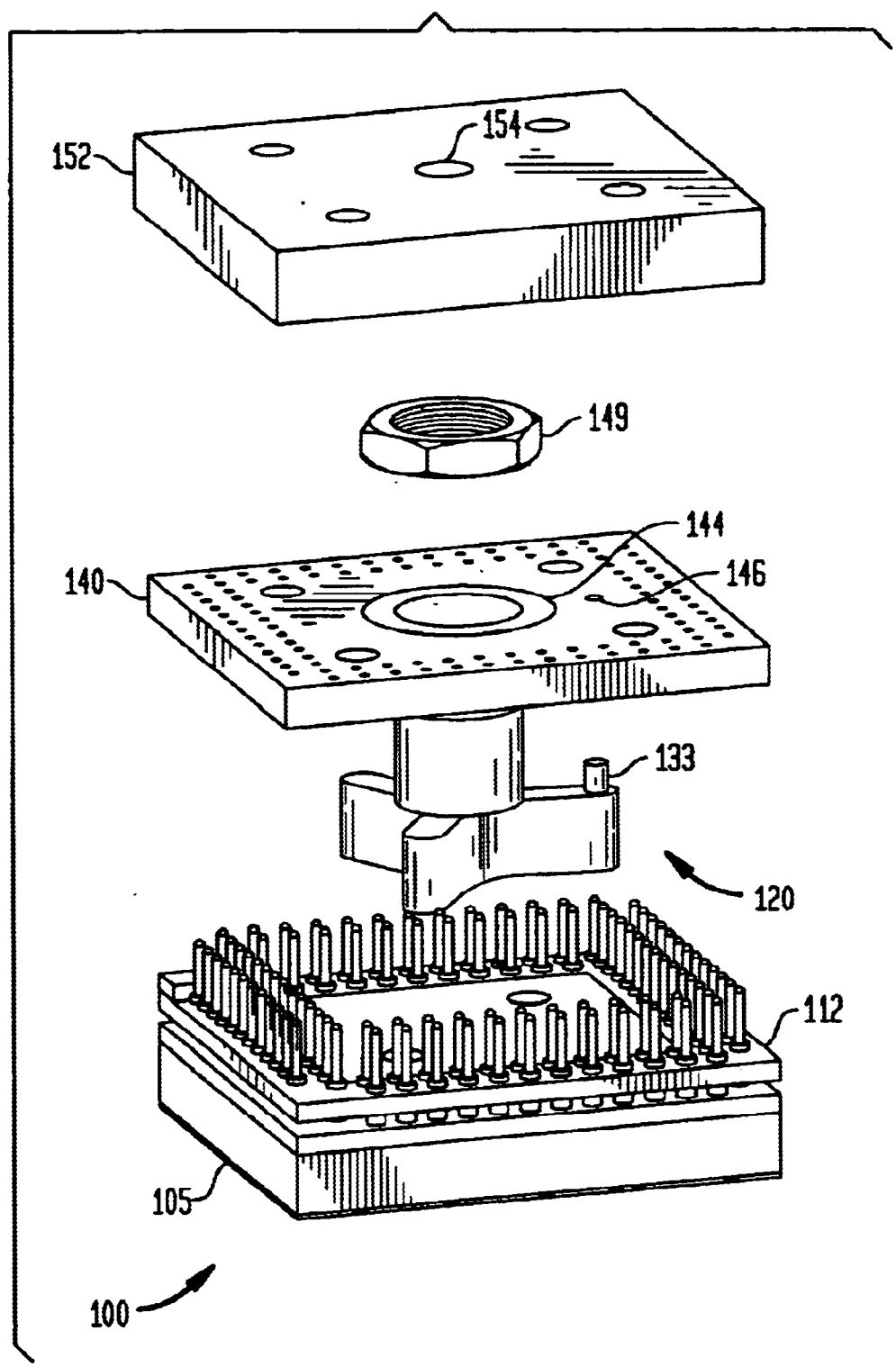
FIG. 1 shows a heat sink system according to one embodiment of the invention.

FIG. 1 shows a heat sink system 100 according to one embodiment of the invention. The heat sink system 100 may include a radiographic sensor device 105, a heat sink 152, an intervening circuit board 140, and a thermal channel device 120.

The radiographic sensor device 105 may be any type of solid state radiographic sensor that produces an electrical signal in response to incident radiation. The detector may be a solid state material such as a CZT (cadmium zinc telluride) detector module, for example. A radiographic sensor device 105 may be employed in a multi-module array that covers a large imaging area.

The radiographic sensor device 105 may include an electrical connector pin grid 112 that forms one or more electrical connections between the radiographic sensor device 105 and the intervening circuit board 140. The electrical connector pin grid 112 may conduct electrical signals between the intervening circuit board 140 and one or more sensors formed as part of the radiographic sensor device 105.

The heat sink 152 may be a typical heat sink formed of a first thermally conductive material, such as a suitable metal. The heat sink 152 receives heat from the thermal channel device 120 and dissipates it into the surrounding environment. This may include dissipating the heat into the surrounding air or into some manner of cooling fluid. The heat sink 152 may optionally include cooling fins or other projections designed to increase the surface area of the heat sink 152 for maximum heat transfer.

Figure 2:
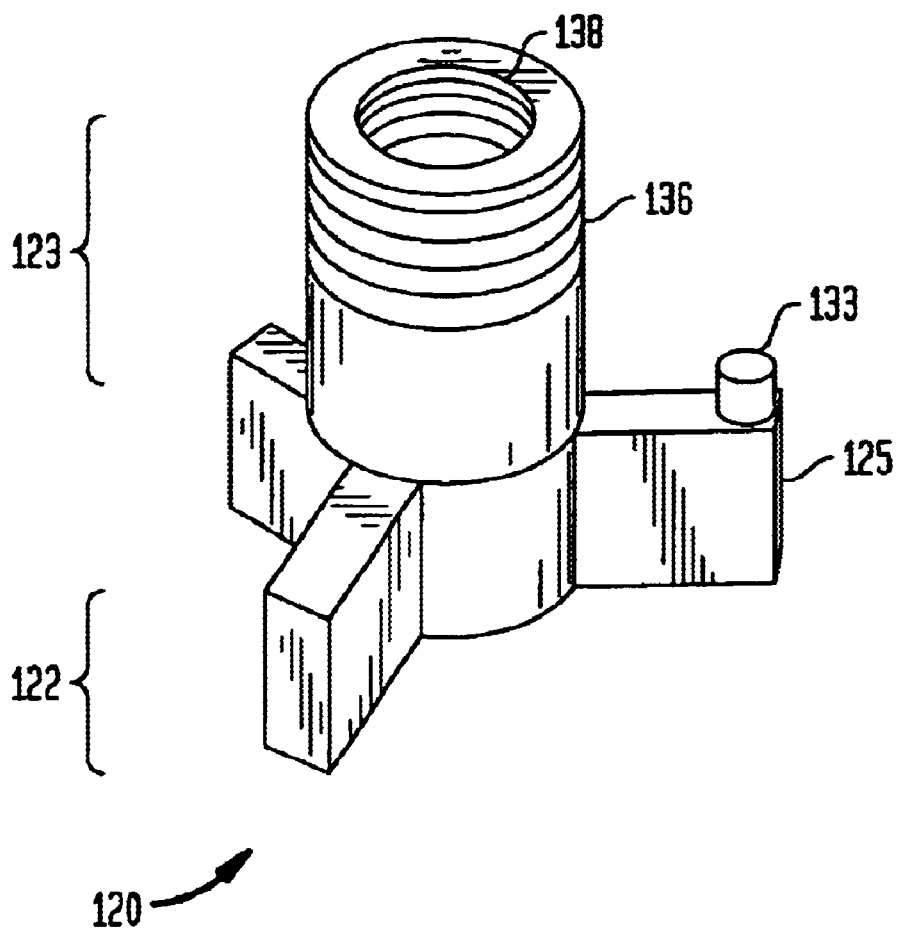
FIG. 2 shows detail of the thermal channel device.
Figure 3:
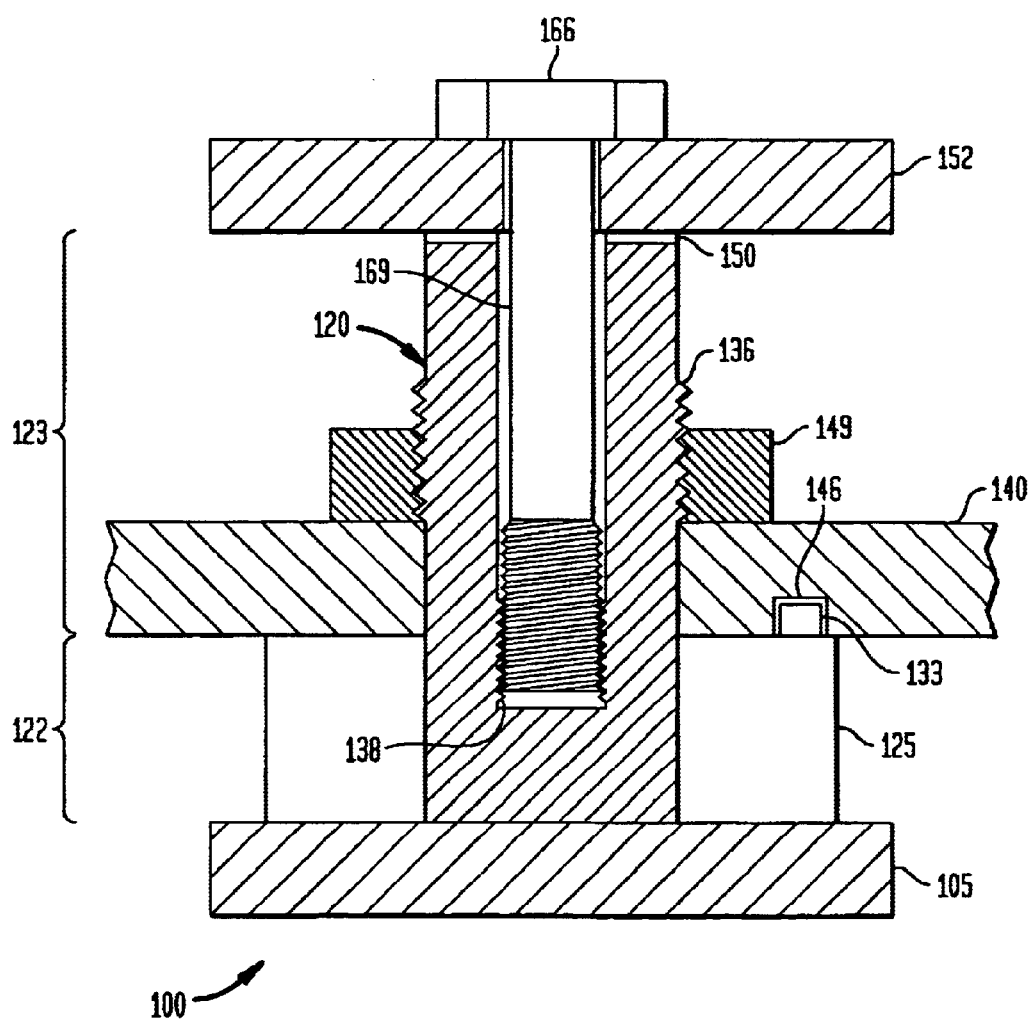
FIG. 3 is a cross-sectional view of the heat sink system.
Figure 4:
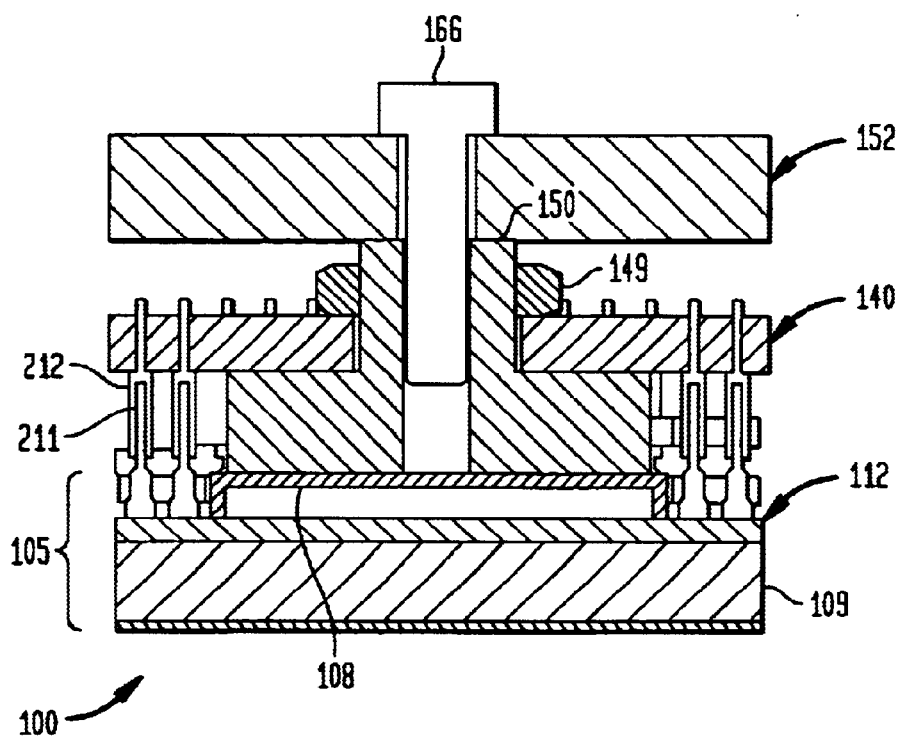
FIG. 4 is a cross-sectional view of another embodiment of the heat sink system.

In addition, the heat sink 152 may include an elongate fastener aperture 154 through which an elongate fastener 166 may pass (see FIGS. 3 and 4). The elongate fastener 166 may penetrate into and be retained in a fastener aperture 138 in the thermal channel device 120 (see FIG. 2). The elongate fastener 166 enables the heat sink 152 to be removably affixed to the thermal channel device 120.

The intervening circuit board 140 may be a circuit board or other detector head element. The intervening circuit board 140 may be in electrical communication with one or more sensors associated with the radiographic sensor device 105. The intervening circuit board 140 may necessitate the use of the thermal channel device 120, as the heat sink 152 cannot therefore practically be located on the radiographic sensor device 105.

The intervening circuit board 140 includes a thermal channel aperture 144 sized to accommodate the upper portion 123 of the thermal channel device 120 (see FIG. 2). It should be understood that although the thermal channel aperture 144 is shown as being substantially circular, it may be of other shapes in order to prevent rotation of the thermal channel device 120, and may include a key-way, rib, etc., for preventing rotation of the thermal channel device 120.

The thermal channel device 120 conducts heat away from the radiographic sensor device 105 to the heat sink 152. The thermal channel device 120 may be formed of a second thermally conductive material with a different coefficient of heat conductivity than the heat sink 152. Alternatively, the heat sink 152 and the thermal channel device 120 may be formed of the same material.

Due to construction of the thermal channel device 120, it not only conducts heat, but also acts as a spacer. The thermal channel device 120 may position the radiographic sensor device 105 in a spaced-apart relation from the heat sink 152. In addition, the thermal channel device 120 may position the radiographic sensor device 105 in a space relation away from the intervening circuit board 140. This is important because the intervening circuit board 140 may be used to uniformly affix a plurality of radiographic sensor devices 105 to a radiographic detector head. Each radiographic sensor device 105 may therefore be positioned a predetermined distance from the intervening circuit board 140 and at a planar orientation that is substantially parallel to the intervening circuit board 140. Therefore, the thermal channel device 120 of the invention is an aid to forming a radiographic detector head comprising a plurality of radiographic sensor devices 105.

The thermal channel device 120 may include a fastener 149 that removably attaches to the thermal channel device 120 when the thermal channel device 120 passes through the thermal channel aperture 144 in the intervening circuit board 140. In one embodiment, both the fastener 149 and the outer surface of the thermal channel device 120 are threaded (see FIG. 2). The fastener 149 therefore may removably attach the thermal channel device 120 to the intervening circuit board 140. Alternatively, the fastener 149 may be frictionally held to the thermal channel device 120 and may comprise some form of spring clip, snap ring, elastomeric ring, etc.

When assembled, the bottom surface of the thermal channel device 120 contacts the radiographic sensor device 105. The upper portion 123 of the thermal channel device 120 passes through the large aperture 144 in the intervening circuit board 140. The intervening circuit board 140 contacts the top surface of the at least one contact projection 125, and the at least one retaining stud 133 fits into a corresponding retaining stud aperture 146 in the intervening circuit board 140 (see FIG. 2). The retaining stud aperture 146 may extend partially or completely through the intervening circuit board 140. The fastener 149 is affixed to the thermal channel device 120 to hold the radiographic sensor device 105 in a spaced-apart, substantially parallel relation with the intervening circuit board 140. The thermal channel device 120 extends through the intervening circuit board 140, and the top surface of the thermal channel device 120 contacts the heat sink 152. The thermal channel device 120 therefore may also hold the radiographic sensor device 105 in a spaced-apart, substantially parallel relation with the heat sink 152. An elongate fastener (see FIG. 2) may pass through the elongate fastener aperture 154 of the heat sink and removably affix the heat sink 152 to the thermal channel device 120.

Due to the advantageous construction of the heat sink system 100 of the invention, each radiographic sensor device 105 of a radiographic imaging device may be separately disassembled for maintenance and repair. Furthermore, each radiographic sensor device 105 may be reassembled with an assurance that the radiographic sensor device 105 will be self-aligned in a proper planar orientation.

FIG. 2 shows detail of the thermal channel device 120. The thermal channel device 120 includes an upper portion 123, which may be substantially cylindrical in shape and may have an external threaded surface 136. In addition, the upper portion 123 may include a fastener aperture 138 extending axially into the upper portion 123. The fastener aperture 138 is preferably also threaded on an inner cylindrical surface.

The thermal channel device 120 further includes a lower portion 122. The lower portion 122 includes at least one contact projection 125. A contact projection 125 comprises an elongate member that maximizes the surface area contact between the thermal channel device 120 and the radiographic sensor device 105. In a preferred embodiment, the lower portion 122 includes three elongate contact projections 125 in order to maximize the planar orientation effect of the thermal channel device 120.

Although the at least one contact projection 125 is shown as being substantially rectangular in shape, other shapes could be employed, such as oblong or irregular. A contact projection 125 may include a retaining stud 133, with the retaining stud 133 engaging the corresponding retaining stud aperture 146 in the intervening circuit board 140 to prevent rotation between the thermal channel device 120 and the intervening circuit board 140.

FIG. 3 is a cross-sectional view of the heat sink system 100. The cross-sectional view illustrates how the fastener 149 and the elongate fastener 166 affix the thermal channel device 120 to the intervening circuit board 140 and to the heat sink 152. The elongate fastener 166 in this embodiment is a bolt having an elongate body 169 that extends down and screws into the fastener aperture 138 of the thermal channel device 120. Therefore, the elongate fastener 166 removably affixes the heat sink 152 to the upper portion 123 of the thermal channel device 120. The elongate fastener 166 provides an additional heat transfer path, in addition to fastening heat dissipating components together.

A thermal gasket 150 may be included between the heat sink 152 and the thermal channel device 120. The thermal gasket 150 may be formed of a suitable heat conductive material, and may additionally be compressible in nature.

The fastener 149, such as a threaded nut in the embodiment shown, screws onto the external threaded surface 136 of the thermal channel device 120. The fastener 149 therefore removably affixes the intervening circuit board 140 against the lower portion 122 of the thermal channel device 120. The intervening circuit board 140 therefore rests on top of the at least one contact projection 125 in order to maintain a substantially parallel spaced-apart relation between the radiographic sensor device 105 and the intervening circuit board 140. This figure also shows the at least one retaining stud 133 positioned in a corresponding retaining stud aperture 146 in the intervening circuit board 140.

FIG. 4 is a cross-sectional view of another embodiment of the heat sink system 100 of the invention. In this cross-sectional view, the pin grid array 112 can be seen, wherein the pins 211 of the pin grid array 112 fit into corresponding sockets 212 on the intervening circuit board 140. The pins 211 and sockets 212 establish electrical connections between the radiographic image sensor 105 and the intervening circuit board 140.

In addition, this figure shows a planarity-establishing surface 108 of the thermal channel device 120 that contacts a surface of the CZT module 109 to draw heat away from the CZT module. In this way, a large surface is provided for the CZT module to abut against, whereby the surface 108 will be parallel to and in the same plane as surfaces of other thermal channel devices used in a multi-module array, thereby ensuring that each CZT module in the array will be in the same plane.

It should be understood that although specific embodiments are shown in the disclosure, the shapes of the upper portion 123 and lower portion 122 of the thermal channel device 120 may be varied and still achieve the same result. In addition, the number, size, and shapes of the contact projections 125 may be varied in order to accommodate variations in radiographic sensors and still control planar orientation and conduct heat. In addition, the intervening circuit board 140 may have various functions and the heat sink 152 may be varied in size, shape and material and still accomplish the purpose of the invention.

While the invention has been described in detail above, the invention is not intended to be limited to the specific embodiments as described. It is evident that those skilled in the art may now make numerous uses and modifications of and departures from the specific embodiments described herein without departing from the inventive concepts.

What is claimed is:

1. An electronic assembly, comprising:
   a radiographic sensor device having a first surface that detects radiation and having a plurality of connector pins arranged in a grid extending from a second surface opposite said first surface;
   a circuit board having a plurality of connector pin sockets on one side thereof that connect with said connector pin grid, and having a thermal channel aperture therethrough;
   a heat sink located on a second side of said circuit board opposite said one side; and
   a thermal channel device having a contact portion and an extending portion, said contact portion having a first surface making contact with said second surface of said radiographic sensor device and having a second surface, opposite said first surface, making contact with said circuit board so as to provide a predetermined spaced-apart relationship between said radiographic sensor device and said circuit board, said contact portion being accommodated within a periphery of said connector pin grid, said extending portion extending from said contact portion through said thermal channel aperture and making thermal contact with said heat sink.

2. The electronic assembly of claim 1, further comprising a compressible thermal gasket positioned between said thermal channel device and said heat sink.

3. The electronic assembly of claim 1, wherein said contact portion includes a retaining stud and said circuit board includes a retaining stud aperture that receives said retaining stud.

4. The electronic assembly of claim 1, wherein said contact portion comprises three elongate members extending substantially radially from said extending portion of said thermal device.

5. The electronic assembly of claim 1, wherein said extending portion is substantially cylindrical and includes a threaded outer surface portion that receives a threaded fastener that removably affixes said thermal channel device to said circuit board.

6. The electronic assembly of claim 1, wherein said extending portion includes an aperture that receives a fastener which removably affixes said thermal channel device to said heat sink.

7. The electronic assembly of claim 1, wherein said thermal channel device has a different coefficient of thermal conductivity than said heat sink.

8. An electronic assembly, comprising:
a radiographic sensor device having a first surface that detects radiation and having a second surface opposite said first surface;
a circuit board that electrically connects with said radiographic sensor device at one side thereof, and having a thermal channel aperture therethrough;
a heat sink located on a second side of said circuit board opposite said one side; and
a thermal channel device having a contact portion and an extending portion, said contact portion having a first surface making contact with said second surface of said radiographic sensor device and having a second surface, opposite said first surface, making contact with said circuit board so as to provide a predetermined spaced-apart relationship between said radiographic sensor device and said circuit board, said extending portion extending from said contact portion through said thermal channel aperture and making thermal contact with said heat sink.

9. The electronic assembly of claim 8, further comprising a compressible thermal gasket positioned between said thermal channel device and said heat sink.

10. The electronic assembly of claim 8, wherein said contact portion includes a retaining stud and said circuit board includes a retaining stud aperture that receives said retaining stud.

11. The electronic assembly of claim 8, wherein said contact portion comprises three elongate members extending substantially radially from said extending portion of said thermal device.

12. The electronic assembly of claim 8, wherein said extending portion is substantially cylindrical and includes a threaded outer surface portion that receives a threaded fastener that removably affixes said thermal channel device to said circuit board.

13. The electronic assembly of claim 8, wherein said extending portion includes an aperture that receives a fastener which removably affixes said thermal channel device to said heat sink.

14. The electronic assembly of claim 8, wherein said thermal channel device has a different coefficient of thermal conductivity than said heat sink.

* * * * *